United States Patent [19]

Crowell

[11] 4,076,531
[45] Feb. 28, 1978

[54] IMAGE ANCHORAGE IN PHOTOGRAPHIC FILMS
[75] Inventor: Richard T. Crowell, Towanda, Pa.
[73] Assignee: E. I. Du Pont de Nemours and Company, Wilmington, Del.
[21] Appl. No.: 600,369
[22] Filed: Jul. 30, 1975
[51] Int. Cl.$^2$ .................. G03C 5/00; G03C 5/30; G03C 1/76; G03C 1/84
[52] U.S. Cl. .................. 96/35; 96/50 R; 96/66 R; 96/67; 96/84 R; 96/87 R; 96/94 R
[58] Field of Search ............. 96/35, 66, 67, 95, 84 R, 96/50, 87 R, 94 R

[56] References Cited
U.S. PATENT DOCUMENTS

| 3,128,182 | 4/1964 | Bard et al. | 96/66.3 |
| 3,674,497 | 7/1972 | Gobran et al. | 96/107 |

Primary Examiner—Mary F. Kelley

[57] ABSTRACT

The anchorage of silver images to their supports, especially in wash-off films developed by tanning developing agents, is improved by incorporating cyclohexylamine or a derivative thereof in the silver halide emulsion layer, in a layer coated between the emulsion and the support, in an overcoat, or in the processing bath.

17 Claims, No Drawings

IMAGE ANCHORAGE IN PHOTOGRAPHIC FILMS

BACKGROUND OF THE INVENTION

1. Field of the Invention

This invention relates to photographic elements having a colloid-silver halide emulsion layer on a colloid or polymer substrate (e.g., a subbed or unsubbed film support) having after development improved anchorage of the silver image to the substrate. More especially, it relates to silver halide photographic elements intended to be developed by the use of tanning developing agents and thereafter subjected to additional treatment to remove unexposed and unhardened areas, and to a development process therefor.

2. Description of the Prior Art

It is a long-standing common practice in the photographic art to coat a colloid-silver halide emulsion on a polymeric film support or to employ an intermediate subbing layer between the emulsion and the support to improve the anchorage of the emulsion to the support. The subbing layer may be a thin coating of a dilute solution of a colloid such as gelatin or it may be a coating of any of a large number of polymeric compositions disclosed in the art for this purpose. The anchorage provided in this way is adequate for many uses but is not always entirely sufficient, especially for films of the wash-off variety, such as are used for drafting films as described, for example, in Moede, U.S. Pat. No. 3,353,958, stripping films, printing plates, resists, and the like. The processing of materials of this kind ordinarily includes a step wherein the exposed and developed film is subjected to a spraying or scrubbing action with water or other liquids to remove the emulsion from the support in the unexposed areas. The silver image, which is intended to be retained on the support, is relatively easily damaged and can be at least partially removed when the spraying or scrubbing action is sufficiently vigorous. Thus, there has been a need to provide anchorage to a degree greater than that offered by prior art subbing layers, particularly for wash-off films of various kinds.

SUMMARY OF THE INVENTION

It has now been found that image anchorage of a colloid-silver halide emulsion to an organic colloid or polymer substrate can be improved by incorporating cyclohexylamine or a derivative thereof either in a layer of a photographic element or in a processing bath as described hereinafter.

Accordingly, the invention comprises a photosensitive element comprising a support bearing at least one photosensitive colloid-silver halide emulsion layer, either the support or an intermediate layer that is between the support and the colloid-silver halide emulsion layer and is contiguous to the colloid-silver halide emulsion layer, being comprised of an organic colloid or polymer, wherein at least one layer on the same side of the support as the colloid-silver halide emulsion layer contains a cyclohexylamine compound.

The invention also comprises a process of developing a silver halide photosensitive element in the presence of a tanning developing agent and a cyclohexylamine compound.

DESCRIPTION OF THE PREFERRED EMBODIMENTS

As used herein, the term "cyclohexylamine compound" means cyclohexylamine or a derivative thereof. Derivatives of cyclohexylamine are substituted species thereof, of which the following are several preferred examples:

cyclohexane carbamic acid cyclohexylammonium salt (also referred to as cyclohexylamine carbonate)

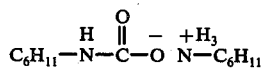

cyclohexaylamine

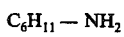

cyclohexylformamide

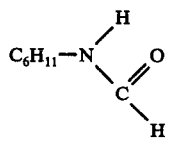

cyclohexyl-1,3-propanediamine

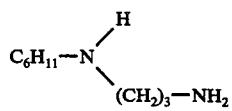

3-cyclohexylamine-1-propane sulfonic acid

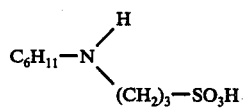

cyclohexyl sulfamic acid

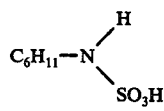

While reference is made to a cyclohexylamine compound, such reference is to be understood to include mixtures of two or more cyclohexylamine compounds.

In one preferred embodiment of the invention, a photosensitive element as described above contains a cyclohexylamine compound in the colloid-silver halide emulsion layer.

In another preferred embodiment of the invention, a photosensitive element as described above contains a cyclohexylamine compound in the intermediate layer. The intermediate layer is contiguous to the colloid-silver halide emulsion layer, and if it is the sole layer between the support and the emulsion layer (e.g., the subbing layer of an element in which the emulsion layer is coated on a subbed support), it will also be contiguous to the support.

Particularly preferred are photographic elements of the wash-off type and elements containing a tanning developing agent, which contain the cyclohexylamine compound in one or more layers as just described.

In still another preferred embodiment, the invention relates to an improved process for tanning development of a photographic element of the wash-off type, wherein the cyclohexylamine compound is incorporated in a processing solution preferably having high alkalinity and low sulfite content, with which the exposed photographic element is contacted before, during, or after development.

In yet another embodiment, the invention relates to a processing bath for use in the tanning development of photographic elements of the wash-off type, the bath comprising (a) a base (e.g., alkali metal hydroxide and/or alkali metal carbonate) such that the bath is characterized by high alkalinity as indicated by a pH value of at least 11.0, (b) alkali metal sulfite in an amount not exceeding 15 grams per liter of the bath, (c) a cyclohexylamine compound and, optionally, (d) a tanning developing agent.

While the cyclohexylamine compound has been defined preferably as being present in the emulsion, in an underlayer, or in a processing bath, it is to be understood that it is within the scope of the invention that the cyclohexylamine compound may alternatively be present in an overcoat, as well as in any combination of two or more of these locations or in all of them. Thus, a given element may incorporate a cyclohexylamine compound in the silver halide emulsion layer as well as in one or more underlayers or in an overcoat, and may in addition be treated in a processing bath that contains a cyclohexylamine compound. In general, however, the desired improvement in anchorage can be achieved when the cyclohexylamine compound is used in only one location, and any further incremental improvement in anchorage obtained by incorporating it in more than one location may not justify the additional cost.

The invention will be discussed and exemplified hereinafter in terms of wash-off films. Wash-off films are those in which the unexposed areas of the colloid-silver halide emulsion layer may be washed off the support with a processing solution.

Particular wash-off films that may be improved according to the invention are the drafting films of Moede, U.S. Pat. No. 3,353,958. A preferred such drafting film comprises (1) a polymeric film support, (2) an acrylic polymer layer, (3) a layer comprising gelatin and a surfactant (e.g., the potassium salt of N-ethyl,N-perfluorooctanesulfonyl glycine), (4) an antihalation layer comprising gelatin and an actinic radiation absorbing material (e.g., carbon black), and (5) a wash-off gelatino-silver halide emulsion layer containing a tanning developing agent, at least one of said layers containing a cyclohexylamine compound. The materials, compositions and procedures discussed are also applicable to other kinds of photographic elements, with such necessary modifications as will be obvious to those skilled in the art. Thus, for example, in addition to the emulsion layer and the underlayer already mentioned, there may be present other layers on the opposite side of the support, on top of the emulsion, or between the support and the emulsion, such additional layers being of compositions and/or for purposes known in the art, e.g., antihalation layers, antiabrasion layers, and the like.

The support may be selected from the many materials known in the art as support materials for photographic elements, and will be chosen with regard to the intended manner of use or intended end product of the element. Thus, there may be used sheets or plates of glass, paper or metal, as well as a variety of polymeric films, either rigid or flexible, and either transparent or nontransparent. Where the support is other than a polymeric film, it must have an organic colloid or polymer subbing layer or other such intermediate layer contiguous to the emulsion layer. Among the useful polymeric films are the cellulosic supports, e.g., cellulose acetate, cellulose triacetate, cellulose mixed esters; polymerized vinyl compounds, e.g., copolymerized vinyl acetate and vinyl chloride, polystyrene, and polymerized acrylates; and films formed from the polyesterification product of a dicarboxylic acid and a dihydric alcohol made according to the teaching of Alles, U.S. Pat. No. 2,779,684, and the patents referred to in the specification of that patent. Other suitable supports are the polyethylene terephthalate/isophthalates of British Pat. No. 766,290 and Canadian Pat. No. 562,672 and those obtainable by condensing terephthalic acid and dimethyl terephthalate with propylene glycol, diethylene glycol, tetramethylene glycol or cyclohexane 1,4-dimethanol (hexahydro-p-xylene alcohol). The films of Bauer et al., U.S. Pat. No. 3,052,543 may also be used. The above polyester films are particularly suitable because of their dimensional stability. A preferred material for many uses is a clear polyethylene terephthalate film base subbed with vinylidene chloride/methyl acrylate/itaconic acid copolymer and gelatin as described in Alles, U.S. Pat. No. 2,779,684. For certain uses, e.g., drafting films, a preferred support is the matted film described in Moede, U.S. Pat. No. 3,353,958, that is, a polyester base coated with a layer of an acrylic polymer containing a matting agent and overcoated with a layer of a gelatin/polymer mixture. Also, a modification of this structure may be used, wherein the gelatin/polymer composition is mixed with the matted acrylic composition before coating rather than applied as a separate layer, the gelatin/polymer component comprising preferably 15–30%, and more preferably about 20%, by weight of the total of matted acrylic composition and gelatin/polymer composition. A preferred material for the gelatin/polymer component is that described in Example II of Moede, U.S. Pat. No. 3,353,958, but other gelatin/polymer compositions may also be used.

The support may bear on one or both surfaces a photosensitive, substantially unhardened silver halide emulsion layer, which may be selected from well-known emulsions containing silver bromide, silver chloride, silver iodide, or mixtures thereof, dispersed in known natural or synthetic organic colloid materials. Gelatin is the preferred colloid material but other materials or mixtures thereof may be used alone or together with gelatin. For wash-off films, the colloid material is preferably capable of being (a) melted or dissolved in water at a temperature of 80°–160° F., preferably 90°–110° F., and (b) hardened by the oxidation products released by the action of a tanning developer on exposed silver halide [see Mees-James, "The Theory of the Photographic Process", Third Edition, The Macmillan Company, New York (1966), pp. 304–306]. In addition to gelatin, other colloid materials that can be used are recited in Moede, U.S. Pat. No. 3,440,049 at column 6, lines 23–39. Mixtures of colloid materials can be used, e.g., mixtures of gelatin and ethyl acrylate up to a maximum ethyl acrylate concentration of about 50% by weight of the mixture. The emulsion may contain adjuvants known in the art, such as stabilizers, antihardening agents, antihalation dyes or pigments, sensitizing dyes, wetting agents, and the like. In one aspect of the present invention, the emulsion also contains cyclohexylamine compound.

Between the support and the emulsion layer(s) there may be one or more nonphotosensitive intermediate layers of substantially unhardened natural or synthetic organic colloid of the kind already described or of a polymeric material. Such additional layer or layers may be of known compositions and for known purposes, e.g., they may contain light-absorbing agents for halation protection, surfactants, antihardening agents, and the like. In one aspect of the present invention, at least one such additional layer is present, and at least one of such additional layers contains the cyclohexylamine compound.

Preferred colloid compositions for the several layers will normally be coated from aqueous solution by various known and conventional coating devices and procedures. It will frequently be desirable and usually preferable to include surfactants in the coating compositions to insure optimum coating performance. A large number of materials, e.g., fluoro compounds, sulfates, phosphates, are known in the art for this purpose, and the amounts or proportions to be used are familiar to the worker skilled in the coating art. Representative materials include the sodium salts of alkylaryl polyether sulfonates; neutral alcohol phosphates; alcohol ether sulfates; sodium salts of fluoroalkyl sulfates; and N-hexadecylbetaine. Mixtures of surfactants are frequently useful, e.g., sodium myristyl ether sulfate and the potassium salt of N-ethyl, N-perfluorooctanesulfonyl glycine, and coating quality may sometimes be further improved by adding a small amount of butyl carbitol to the coating solution.

In some instances, it may be desirable to include in the coating composition an antihardening agent for the colloid material, of the kind and in amounts and proportions known in the art, to maintain solubility of the layer with age. Among the known useful materials are hydroxylamine salts, e.g., hydroxylammonium sulfate at a concentration of 5-50%, preferably 20-30%, by weight of the colloid material; also, 5,5-dimethyl-1,3-cyclohexanedione, cyclohexanone oxime, 2,4-pentanedione dioxime, dimethyl glyoxime, and diphenyl glyoxime.

The organic colloid and polymer materials used in the various layers of the photographic elements may be the same or different and, in the case of mixtures of the same materials, may be mixed in the same or different proportions in the different layers. Likewise, the adjuvants such as antihardening agents and surfactants that may be incorporated in the several layers may be the same or different and in the same or different amounts in the several layers. When cyclohexylamine compound is incorporated in more than one layer of a photographic element, e.g., in both the emulsion layer and an underlayer, it may be included in the same or different amounts in the different layers.

In one particularly beneficial application of the invention, the emulsion is of the wash-off variety, intended for use in conjunction with tanning developers, such as catechol, pyrogallol, alkyl gallates, hydroquinone, and the like. A preferred group of tanning developers are the polyhydroxy-spiro-bis-indane compounds of Moede, U.S. Pat. No. 3,440,049. Mixtures of tanning developers can be used, and tanning developers can be used in conjunction with nontanning developers. A tanning developer can be incorporated in one or more of the layers of the photographic element, including the emulsion, an underlayer, or a separate layer coated over the emulsion, and the same or different tanning developers or mixtures thereof can be used in the different layers. Also, as known in the art, the tanning developer can be omitted entirely from the photographic element and incorporated with an activator in a bath in which the element is treated after exposure. Whether incorporated in the element or applied separately and subsequently, the tanning developers will be used in conjunction with alkaline activating agents known in the art. In known manner, the alkaline bath reduces the exposed silver halide and at the same time brings about hardening of the colloid material, e.g., gelatin, in the exposed image areas of the colloid-silver halide layer while leaving unexposed, nonimage areas unhardened. When the exposed and developed element is subsequently submitted to transfer, stripping or wash-off procedures, the unhardened, nonimage areas are removed. Representative applications of this type include lithographic printing plates, photoresists, and a variety of wash-off films and stripping films. Numerous procedures for removing the unexposed, unhardened areas of the photographic elements are known for each of these applications, and these known procedures can be used satisfactorily with the improved photographic elements or in the improved photographic process of this invention, with the advantage, provided by this invention, of enhanced anchorage of the silver image to the support, hence, less likelihood of damaging or even destroying the silver image by the wash-off or other procedures used to remove unexposed, unhardened areas from the support.

In one aspect of the invention, an exposed photographic element is developed by a process that includes the step of contacting the exposed element before, during or after tanning development with a solution that contains a cyclohexylamine compound. The solution may also include (a) alkali metal hydroxide and/or alkali metal carbonate such that the bath is characterized by high alkalinity as indicated by a pH value of at least 11.0, and (b) alkali metal sulfite in an amount not exceeding 15 grams per liter of the bath. The photographic element may or may not also contain a cyclohexylamine compound in one or more of its layers. In the process aspect, the step of treating the exposed element with a cyclohexylamine compound may conveniently be combined with another step in the development procedure. In the case of wash-off films, for example, the cyclohexylamine compound may preferably be included in the alkaline activator bath for the tanning developing agent, and the tanning developing agent may, as already noted, be incorporated in the photographic element or in the bath or in both.

The invention is illustrated by the examples that follow, wherein parts and percentages are by weight unless otherwise specified.

EXAMPLES I-IV

These examples illustrate wash-off drafting films that incorporate cyclohexylamine in a layer between the support and the emulsion. A photosensitive element was prepared comprising a polyethylene terephthalate film base subbed with vinylidene chloride/methyl acrylate/itaconic acid terpolymer as described in Alles, U.S. Pat. No. 2,779,684, and coated with a matted acrylic layer essentially like that described in Example I of Moede, U.S. Pat. No. 3,353,958 but modified to contain a gelatin/polymer component like that described in Example II of the same Moede patent in the matted acrylic composition replacing part of the acrylic polymer, in the ratio of 76 parts acrylic polymer and 20 parts gelatin/polymer. Over the matted acrylic layer there was coated a layer of a composition made up of 990 parts distilled water, 10 parts gelatin, and 1 part of the potassium salt of N-ethyl, N-perfluorooctanesulfonyl glycine to give a dry coating weight of approximately 1 mg of gelatin per square decimeter.

Over the clear gelatin layer there was coated an antihalation layer that contained cyclohexylamine. The composition of this layer was 960 parts distilled water, 15 parts gelatin, 18 parts of an aqueous dispersion of carbon black containing 34% by weight carbon black, 4 parts hydroxylammonium sulfate, 1 part of the potassium salt of N-ethyl, N-perfluorooctanesulfonyl glycine, and cyclohexylamine. The amounts of cyclohexylamine added for the several samples are given in Table 1, expressed in terms of milligrams of cyclohexylamine per unit area of the dried coating. The antihalation composition containing cyclohexylamine was coated to give a dry coating weight of approximately 2 mg of gelatin/dm$^2$.

Over the antihalation coating there was then coated a wash-off silver halide emulsion layer containing an orthosensitizing dye and an indane tanning developing agent of the kind described in Moede, U.S. Pat. No. 3,440,049, to give a dry coating weight of approximately 400 mg of AgNO$_3$/ft.$^2$ [43 mg/dm$^2$]. The indane tanning developing agent was included to the extent of 30 mg/ft.$^2$ [3.2 mg/dm$^2$] of the dry coating, and on a dry basis there was one part of the indane tanning developing agent for seven parts of gelatin in the coating.

Each of the elements thus prepared was exposed through a negative consisting of a series of clear, evenly spaced parallel lines (100 lines/inch) [(40 lines/cm)] in a nontransparent background. After exposure, each of the elements was treated for 10 seconds at room temperature in an alkaline bath (pH + approx. 13.5) of the following composition: 97 gm potassium carbonate, 35 gm potassium hydroxide, 3.75 gm potassium sulfite, 0.225 gm potassium bromide, 10 gm hydroquinone, and water to make 1 liter.

Each of the elements was then washed with water at 105°–110° F. [40°–43° C.] to remove unexposed, unhardened areas of the several layers, then the remaining silver images of the lines were rubbed 8 times with a wet sponge and the percentage of the lines remaining anchored to the support after rubbing was visually estimated. It was also determined that, when the visual percentage estimate was 85% or greater, no anchorage failure was observed when the same elements were exposed and processed on mechanical equipment using normal wash-off processing procedures and conditions, whereas the frequency of anchorage failure under the same conditions was seen to increase for elements that gave visual estimated values of less than 85%. The results for the sponge rubbing test were:

Table 1

| Example | Cyclohexylamine mg/ft.$^2$ | mg/dm$^2$ | % Lines Remaining |
|---|---|---|---|
| Control | None | None | 40 |
| I | 5 | 0.54 | 65 |
| II | 15 | 1.61 | 90 |
| III | 20 | 2.15 | 100 |
| IV | 50 | 5.38 | 100 |

EXAMPLES V–VII

The procedures and compositions of Examples I–IV were repeated except that derivatives of cyclohexylamine were used in the antihalation layer rather than cyclohexylamine itself. The derivatives used, the amount of each, and the results in the sponge rubbing test are given in Table 2.

Table 2

| Example | Cyclohexylamine Derivative Identity | mg/ft.$^2$ | mg/dm$^2$ | % Lines Remaining |
|---|---|---|---|---|
| Control | None | None | None | 40 |
| V | Cyclohexyl sulfamic acid | 45 | 4.84 | 90 |
| VI | Cyclohexane carbamic acid cyclohexyl ammonium salt | 7 | 0.75 | 85 |
| VII | " | 20 | 2.15 | 100 |

EXAMPLES VIII–X

The procedures and compositions of the preceding examples were repeated except that no cyclohexylamine compounds was incorporated in the antihalation layer. Instead, cyclohexylamine was incorporated in the alkaline processing bath already described, in the amounts and with the results shown in Table 3.

Table 3

| Example | Cyclohexylamine ml/l in Bath | % Lines Remaining |
|---|---|---|
| Control | None | 50 |
| VIII | 3 | 80 |
| IX | 6 | 100 |
| X | 9 | 100 |

EXAMPLES XI–XIX

Examples VIII–X were repeated except that in place of cyclohexylamine itself various derivatives of cyclohexylamine were added to the alkaline processing bath, in the amounts and with the results shown in Table 4.

Table 4

| Example | Cyclohexylamine Derivative Identity | g/l | % Lines Remaining |
|---|---|---|---|
| Control | None | None | 40 |
| XI | Cyclohexane carbamic acid cyclohexylammonium salt | 2 | 70 |
| XII | " | 7 | 100 |
| XIII | " | 20 | 100 |
| XIV | 3-Cyclohexylamino-1-propane sulfonic acid | 26 | 65 |
| XV | " | 38 | 100 |
| XVI | " | 50 | 100 |
| XVII | Cyclohexyl-1,3-propanediamine | 3 | 80 |
| XVIII | " | 10 | 95 |
| XIX | Cyclohexyl formamide | 20 | 95 |

From all of the foregoing data it can be seen that it is not possible to specify exact quantitative amounts for the additive. Taking Table 4 for purposes of discussion, it will be seen, for example, that 100% of the lines remain in Example XII when only 7 g/l of additive are employed, but that 38 g/l of a different additive are required to achieve the same 100% lines-retained figure for Example XV. Nonetheless, it is apparent in every instance that a significant improvement in adhesion of the image to the support results when a cyclohexylamine compound is employed according to this invention, either in the alkaline processing bath or in a layer of the photographic element.

The improved elements and process of this invention are useful for enhancing the anchorage of an image to a support in a broad variety of photographic materials and processes. They are especially advantageous for a number of wash-off films and processes, wherein unexposed, unhardened image areas are removed from the photographic element after development, usually by mechanized scrubbing or spraying operations that can be especially harmful to the silver image that is intended to remain on the support. Typical of these applications are a wide variety of drafting films, stripping films, photoresists of various kinds, lithographic printing plates, and the like, but these are mentioned as representative only and the invention is not limited to these applications.

What is claimed is:

1. A photosensitive drafting film comprising a polymeric film support bearing, in order, (1) a polymeric subbing layer, (2) an acrylic polymer layer, (3) a layer comprising gelatin and a surfactant, (4) an antihalation layer comprising gelatin and an actinic radiation-absorbing material, and (5) a wash-off gelatino-silver halide emulsion layer, at least one of said layers on said support containing a compound selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid.

2. The photosensitive drafting film of claim 1 wherein said actinic radiation-absorbing material is carbon black.

3. The photosensitive drafting film of claim 1 wherein said polymeric subbing layer 1) is a vinylidine chloride/methyl acrylate/itaconic acid copolymer, and the acrylic polymer in acrylic polymer layer 2) is poly(-methyl methacrylate).

4. A processing bath for use in the tanning development of photographic elements of the wash-off type, the bath comprising (a) a base providing a pH of at least 11, (b) an alkali metal sulfite in an amount not exceeding 15 grams per liter of the bath, and (c) a member selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid.

5. The processing bath of claim 4 which further contains a tanning developer.

6. The processing bath of claim 5 wherein said tanning developer is a member selected from a group consisting of catechol, pyrogallol, an alkyl gallate, hydroquinone, and a polyhydroxy-spiro-bis-indane.

7. A photosensitive element comprising a support bearing at least one photosensitive colloid-silver halide emulsion layer containing a member selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid.

8. The photosensitive element of claim 7 wherein said colloid-silver halide emulsion is a gelatino-silver halide emulsion, and said support is a polymeric film.

9. A photosensitive element comprising a support, a photosensitive colloid-silver halide emulsion layer on said support, and a further layer positioned on the same side of the support as the colloid-silver halide emulsion layer and contiguous thereto, and containing a member selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid.

10. The photosensitive element of claim 9 wherein said further layer is an intermediate layer positioned between the support and the emulsion.

11. The photosensitive element of claim 9 wherein said further layer is an overcoat covering the colloid-silver halide emulsion layer.

12. The photosensitive element of claim 9 wherein said colloid-silver halide emulsion layer is a gelatino-silver halide emulsion layer, and said support is a polymeric film.

13. A photosensitive element comprising a support, a photosensitive colloid-silver halide emulsion layer on said support, an intermediate layer positioned between said support and said emulsion layer, and an overcoat layer positioned over the colloid-silver halide emulsion layer, both said intermediate layer and said overcoat containing a member selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid; said member serving, after development, to improve the anchorage of the silver image to the support.

14. In a process of photographic development wherein a photographic film having a colloid-silver halide emulsion deposited on a film support is exposed, developed and subjected to a spraying or scrubbing action with water or other liquids to remove the emulsion from the support in unexposed areas, in which there is danger of the silver image being damaged or partially removed by the spraying or scrubbing action, the improvement comprising contacting the exposed film before, during, or after development, with a processing solution which contains a member selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid; said member serving, after development, to improve the anchorage of the silver image to the support.

15. The process of claim 14 wherein said processing solution is an alkaline bath comprising (a) a base providing a pH of at least 11, (b) an alkali metal sulfite in an amount not exceeding 15 grams per liter of the bath, and (c) a member selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid.

16. The process of claim 15 wherein said alkaline bath additionally contains a tanning developing agent selected from the group consisting of catechol, pyrogallol, an alkyl gallate, hydroquinone, and a polyhydroxy-spiro-bis indane.

17. The process of claim 14 wherein said photographic film contains, in one or more layers of the film, a compound which serves to improve the anchorage of the silver image to the support after development, said compound being selected from the group consisting of cyclohexylamine, cyclohexane carbamic acid cyclohexylammonium salt, cyclohexylformamide, cyclohexyl-1,3-propanediamine, 3-cyclohexylamine-1-propane sulfonic acid, and cyclohexyl sulfamic acid.

* * * * *